United States Patent [19]
Son

[11] Patent Number: 6,072,242
[45] Date of Patent: Jun. 6, 2000

[54] CONTACT STRUCTURE OF SEMICONDUCTOR MEMORY DEVICE FOR REDUCING CONTACT RELATED DEFECT AND CONTACT RESISTANCE AND METHOD FOR FORMING THE SAME

[75] Inventor: Jin-Yeong Son, Kyonggi-do, Rep. of Korea

[73] Assignee: Samsung Electronics, Co., Ltd., Suwon, Japan

[21] Appl. No.: 09/209,649

[22] Filed: Dec. 10, 1998

[30] Foreign Application Priority Data

Dec. 12, 1997 [KR] Rep. of Korea ............ 97-68246

[51] Int. Cl.[7] .................. H01L 23/48; H01L 23/52; H01L 29/40
[52] U.S. Cl. .................. 257/774; 257/773; 257/775; 257/786
[58] Field of Search ........................ 257/382, 383, 257/384, 385, 735, 737, 738, 773, 774, 775, 786

[56] References Cited

U.S. PATENT DOCUMENTS

| | | |
|---|---|---|
| 4,288,808 | 9/1981 | Hantisch . |
| 5,444,020 | 8/1995 | Lee et al. ............... 437/195 |
| 5,523,920 | 6/1996 | Machnga et al. ........... 361/767 |

*Primary Examiner*—Ngân V. Ngô
*Attorney, Agent, or Firm*—Marger Johnson & McCollom, P.C.

[57] ABSTRACT

A contact structure for a semiconductor memory device that reduces contact related defects and contact resistance and a method for forming the same are provided. The semiconductor memory device having an insulation layer formed on a conductive layer includes a contact formed within an opening having a bilobate shape. The contact passes through a part of the insulation layer up to the upper surface of the conductive layer from the top of the insulation layer.

5 Claims, 4 Drawing Sheets

CONTACT STRUCTURE OF SEMICONDUCTOR MEMORY DEVICE FOR REDUCING CONTACT RELATED DEFECT AND CONTACT RESISTANCE AND METHOD FOR FORMING THE SAME

BACKGROUND OF THE INVENTION

1. Field of the Invention

The present invention relates to a semiconductor memory device and a method for fabricating the same, and more particularly, to a contact structure for a semiconductor memory device that reduces contact defects and contact resistance and a method for forming the same.

2. Description of the Related Art

In a semiconductor memory device such as dynamic random access memory (DRAM) devices having a plurality of memory cells each consisting of one access transistor and one storage capacitor, an increase in cell density inevitably demands a reduction in the size of the transistor and the capacitor in order to prevent an increase in memory chip size. The higher the integration density, the smaller the size of the semiconductor device. Therefore, there is a demand for an advanced technique for forming a contact between conductive layers in order to ensure operation of the semiconductor memory device. A reduction in the size of the semiconductor device leads to a reduction in operating voltage. For instance, a power supply voltage of 1.2 V has been proposed for a 256-Megabit DRAM whereas a power supply voltage of 1 V or less has been proposed for a 1-Gigabit DRAM.

Accordingly, a need exists for an advanced contact forming technique capable of reducing the semiconductor device in size and providing a good ohmic contact at lower power supply voltages. In order to contact a lower conductive layer having a limited area with an upper conductive layer through an insulation layer formed on the lower conductive layer, a technique for reducing a contact resistance by forming at least two through openings has been proposed. However, the space between the adjacent through openings is narrow due to the reduction of the semiconductor device. If the through openings are overlapped, a peak point P may be generated as shown in FIG. 1.

Referring to FIG. 1, openings C1 and C2 passing through an interlayer insulation layer 30 are formed on a lower conductive layer 20 on a substrate 10. The through opening C1 has an etched surface 31 formed by isotropic etching at an upper side and has an etched surface 33 formed by anisotropic etching at a lower side. Similarly, the opening C2 has an etched surface 32 formed by isotropic etching at an upper side and has an etched surface 34 formed by anisotropic etching at a lower side. Thus, an isotropic etching of the insulation layer 30 is necessary to form the surfaces 31 and 32. The peak point P is produced by excessive anisotropic etching of the insulation layer 30. If a contact is made by filling the openings C1 and C2 with a metal contact plug, contact related defects, for example, poor contact, migration, and the like, can occur during subsequent processes. Moreover, since the lower contact area of the contact plug is considerably smaller in size than the upper contact area, a contact resistance problem arises.

To overcome these problems in a double contact structure such as that shown in FIG. 1, a photo masking process for forming the contact has been proposed as indicated in FIG. 2. This technique has a scheme for forming one through opening having the size corresponding to the total size of the adjacent through openings on an interlayer insulation layer.

In detail, a mask 50 having a rectangular pattern 52 formed on a glass substrate 51 coated with chromium is provided to form a pattern on a photoresist 40. The size of the rectangular pattern 52 is determined by considering the total size of the two through openings. In an exposing process, a light beam such as a laser beam or ultraviolet ray pass through the pattern 52 of the mask 50, reaching the upper side of the photoresist 40. Further, the light beam is reflected at the surface of the glass substrate 51, not passing through it. Therefore, an exposed part 41 is distinguished from an unexposed part 42. Only subsequent processes develop the exposed part 41.

If the exposed part 41 is etched after development, one contact hole is formed as the through opening on an insulation layer 30 of an oxide layer. If the remaining unexposed part 42 of the photoresist 40 is removed and the through opening is filled with tungsten, there is formed the contact plug for contacting a partial surface of a lower conductive layer 20 with an upper conductive layer to be formed on the insulation layer 30. However, since the plane of the contact plug appears as an elliptical shape instead of circular in shape, the contact area is reduced. In other words, the size of the opening is smaller than the total size of the two openings. This is because the unexposed part 41 is formed as the elliptical shape due to a diffraction of light and an interference phenomenon during an exposing process. Consequently, the contact area is reduced by the pattern of the rectangular shape, and it is difficult to provide a good ohmic contact at lower power supply voltages. Hence, it is necessary to both increase the contact area and reduce the contact related defects.

SUMMARY OF THE INVENTION

It is an object of the present invention to overcome the problems associated with prior art contact structures.

It is another object of the present invention to provide a contact structure for a semiconductor memory device that reduces contact related defects and contact resistance and a method for fabricating the same.

It is yet another object of the present invention to provide a contact structure for a semiconductor memory device capable of providing a good ohmic contact at low power supply voltages and a method for fabricating the same.

It is still another object of the present invention to provide an improved contact structure for a semiconductor memory device that easily reduces contact related defects and contact resistance without additional process steps and a method for fabricating the same.

According to one aspect of the present invention, a semiconductor memory device, comprises a conductive layer formed on a semiconductor substrate and an insulation layer formed on the conductive layer. An opening is formed through a portion of the insulation layer on a portion of the conductive layer, the opening having a bilobate shape. A contact is formed in the opening. The semiconductor memory device further comprises an upper surface of the conductive layer that is exposed by the opening, the upper surface of the conductive layer having a bilobate shape with a first and a second round portions connected by a bridge portion.

According to another aspect of the present invention, a photomask for manufacturing semiconductor devices comprises a first portion, a second portion, and a bridge portion connecting the first and second portions together. The first and second portions are substantially square and the bridge portion is about 0.3 μm long.

According to yet another aspect of the present invention, a photomask for manufacturing semiconductor devices comprises a first substantially square portion, a second substantially square portion, and a predetermined distance between the first and the second portion. The predetermined distance is about 0.3 µm.

According to yet another aspect of the present invention, a method for forming a contact in a semiconductor memory device comprises forming a conductive layer on a substrate; forming an insulation layer on the conductive layer; depositing a photoresist on the insulation layer; exposing the photoresist using a photomask; the photomask having a first and a second portions; developing the exposed photoresist; etching the exposed photoresist to form an opening having a substantial bilobate shape; the opening passing through a part of the insulation layer to an upper surface of the conductive layer; removing unexposed photoresist; and filling the opening with a conductive material.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components.

DETAILED DESCRIPTION OF THE PREFERRED EMBODIMENT

Figure 1:
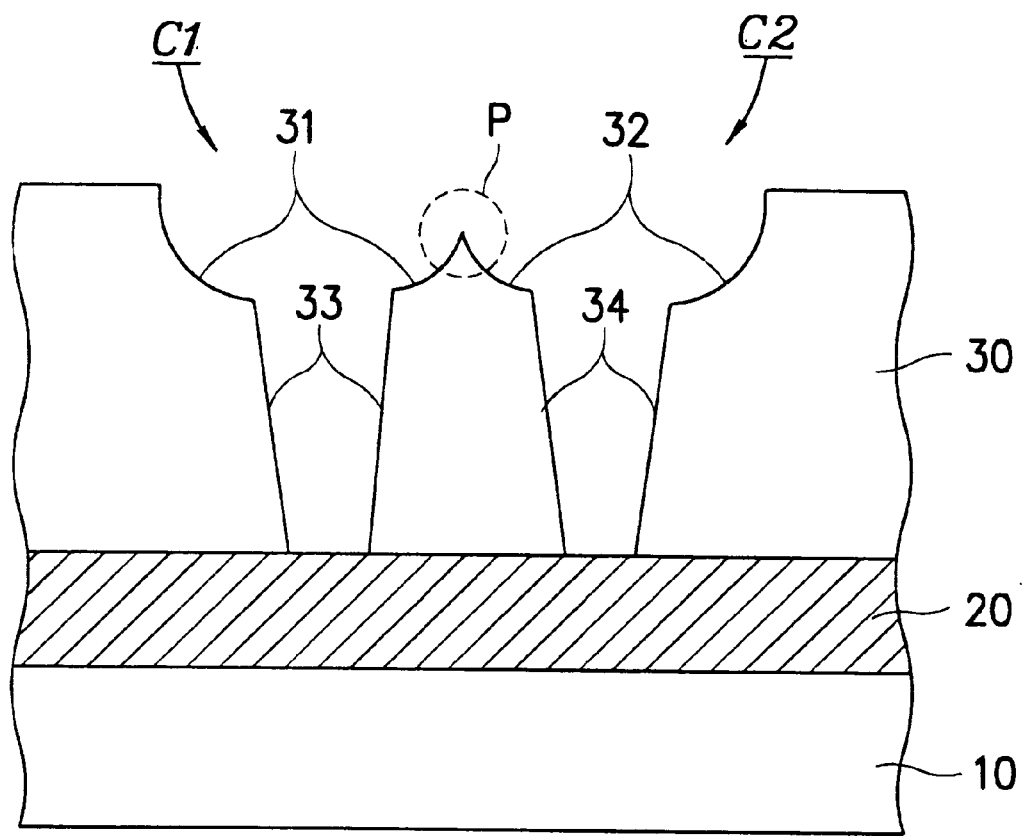
FIG. 1 is a cross-sectional view of a double contact structure for a semiconductor memory device according to the prior art.
Figure 2:
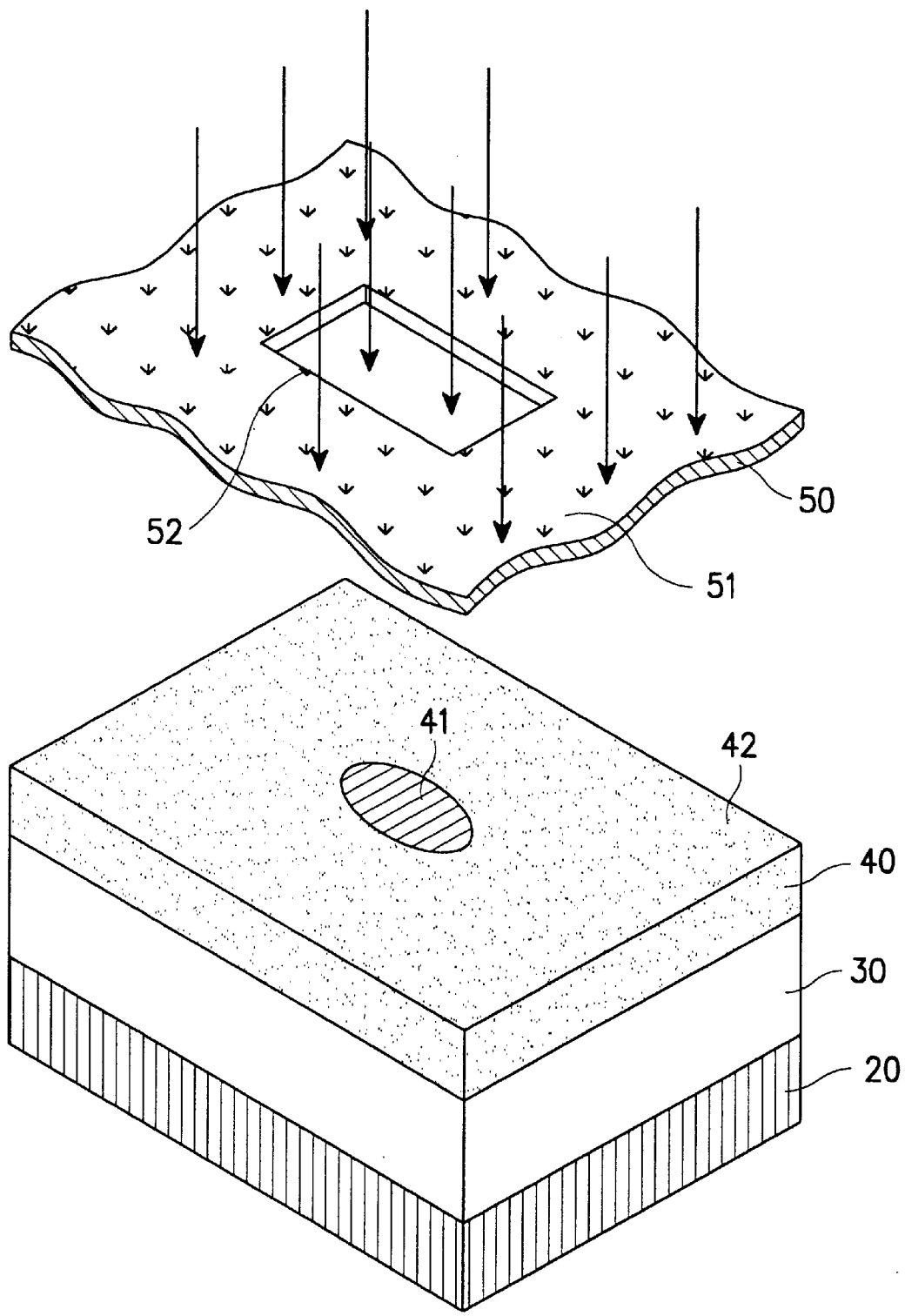
FIG. 2 is an enlarged perspective view of a photo masking process for forming a contact structure according to the prior art.
Figure 3:
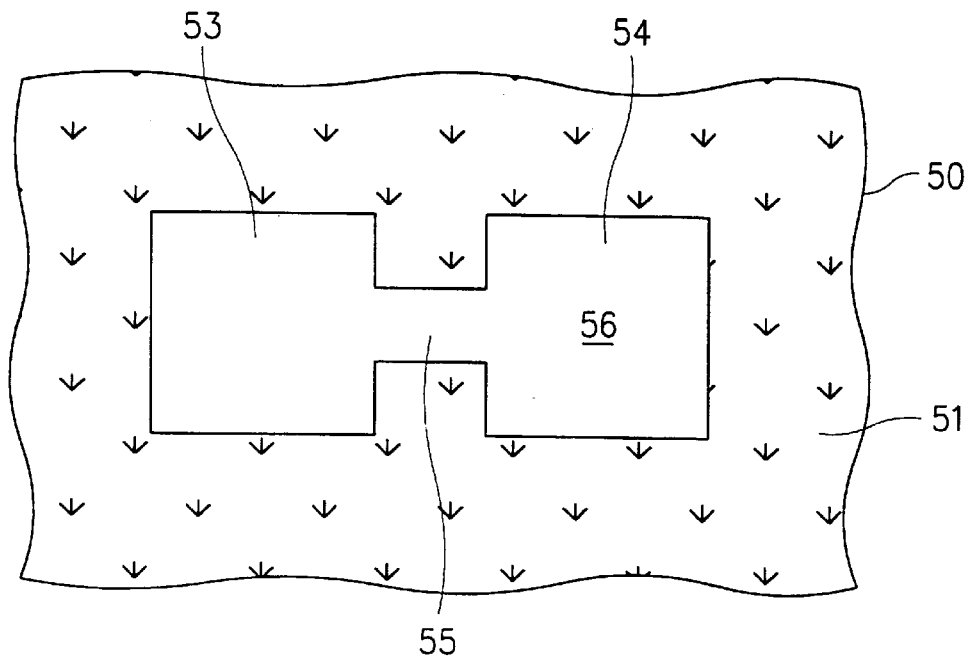
FIG. 3 is a top view of a photomask according to a preferred embodiment of the present invention.

Referring to FIG. 3, to form an opening having a bilobate shape that passes through a part of an insulation layer to an upper surface of a lower conductive layer from the top of an interlayer insulation layer, a photomask 50 is applied. The photomask 50 includes a pattern 56, square portions 53 and 54, and a bridge portion 55 formed on a glass substrate 51. The square portions 53 and 54 are separated from each other. The bridge portion 55 forms a closed curved surface by connecting the angled parts 53 and 54 with each other. Although FIG. 3 illustrates the photomask 50 for a positive photoresist process, it should be apparent to one skilled in the art that a similar structure for a negative photoresist process is also possible. That is, the photomask 50 may have a structure in which the pattern 56 is coated with chromium and ultraviolet rays, laser beams, or electronic beams pass through the glass substrate 51.

In order to form a contact for a semiconductor memory device having an insulation layer 30 formed on a conductive layer 20 (FIG. 6), a photoresist 40 is deposited on the insulation layer 30. Using the photomask 50 having the structure shown in FIG. 3 exposes the photoresist 40. The exposed photoresist is developed and etched thereby forming a through opening 34 passing through the top of the insulation layer 30 to the upper surface of the conductive layer 20. The photoresist that is not developed is removed and the through opening 34 is filled with conductive material to form a contact plug 35.

Figure 4:
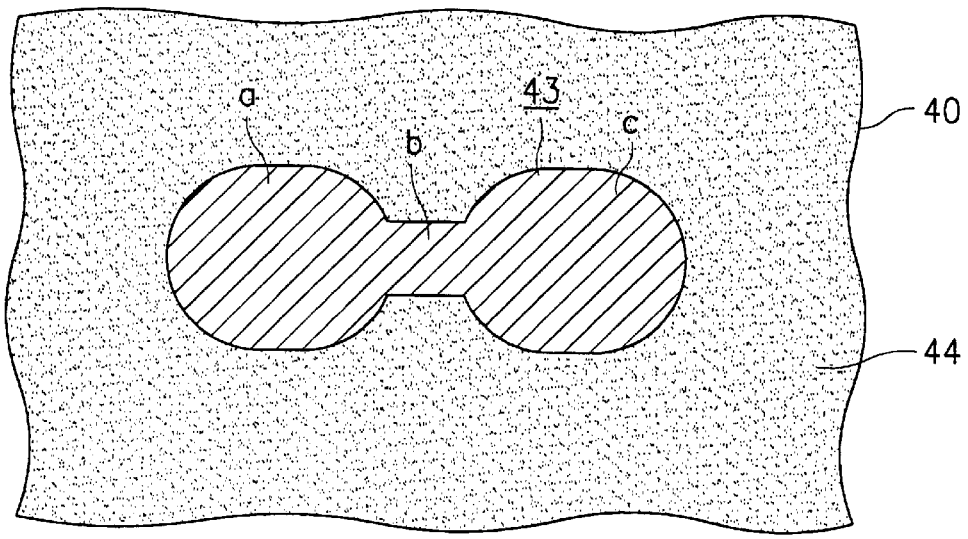
FIG. 4 is a top view of a latent image pattern of a photoresist exposed to a light beam using the photomask shown in FIG. 3.
Figure 6:
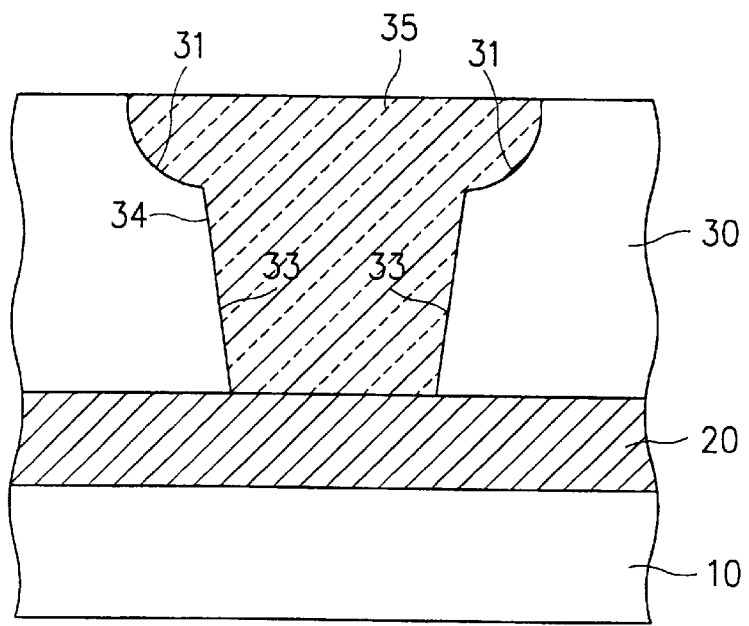
FIG. 6 is a cross-sectional view of a contact structure formed by etching the pattern shown in FIG. 4.

Referring to FIG. 4, a latent image pattern 43 of the positive photoresist 40 exposed to the light beam by using the photomask 50 is distinguished from an unexposed portion 44. The latent image pattern 43 having a bilobate shape has round portions a and c. Round portions a and c are separated from each other by a bride portion b. Bridge portion b forms a closed curved surface by connecting the round portions a and c. A semiconductor exposing apparatus is used to transfer the pattern 56 on the photomask 50 to the photoresist 40 formed on the interlayer insulation layer 30 (FIG. 6). The light beam generated by the semiconductor exposing apparatus is preferably light having about a 248-nanometer wavelength. The semiconductor exposing apparatus is preferably an eximer laser or a mercury lamp.

FIG. 6 shows a contact structure formed by etching the pattern shown in FIG. 4. If only the latent image pattern 43 is developed during a developing process, a portion of the top of the interlayer insulation layer 30 is exposed. The shape of the exposed interlayer insulation layer is the same as that of the latent image pattern 43. If the exposed interlayer insulation layer is etched, one contact hole 34 is formed as the through opening. While wet etching is performed for a prescribed time and dry etching is performed until the upper portion of the lower conductive layer 20 is exposed, the isotropic etching and the anisotropic etching are implemented. Therefore, the contact hole 34 has a round etching surface 31 and a linear etching surface 33 as shown in FIG. 6. The upper surface of the conductive layer 20 exposed by the through opening 34 has a bilobate shape similar to the pattern 43.

The contact plug 35 is formed by removing the unexposed part 44 remaining on the photoresist 40 and filling the through opening 34 with a metal (e.g., tungsten). The contact plug 35 connects a part of the lower conductive layer 20 with an upper conductive layer later formed on the insulation layer 30. Since the plane shape of the contact plug 35 has the larger area than the elliptical shape of the prior art, the contact area is increased thereby improving the ohmic contact even at lower power supply voltages. That is, since there is no peak point on the insulation layer even contact related defects and the contact resistance are both reduced. Importantly, no fabrication processes are added to achieve these reductions.

Figure 5:
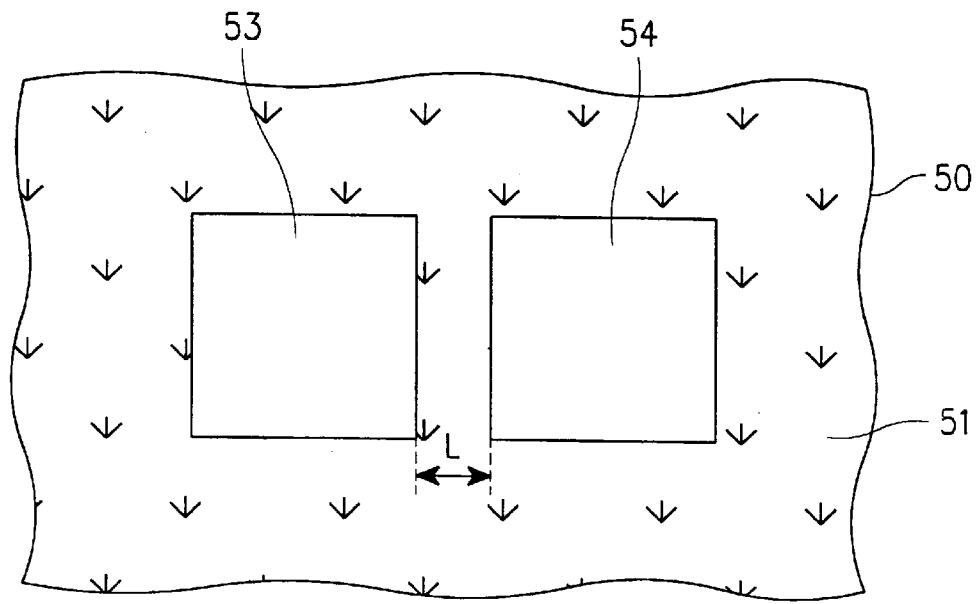
FIG. 5 illustrates a top view of a photomask according to another embodiment of the present invention.

Referring to FIG. 5, there is illustrated the photomask 50 having square portions 53 and 54 separated from each other on the glass substrate 51 coated with chromium. As a modification of such a positive photoresist process, the structure of the photomask 50 may be changed. For example, the photomask 50 may have a structure in which the pattern is coated with the chromium and ultraviolet rays, laser beams, or electronic beams pass through the glass substrate 51. A distance L between the two square portions 53 and 54 is a notable parameter. In a preferred embodiment of the present invention, the distance L is less than 0.3 µm.

The pattern similar to the latent image pattern 43 shown in FIG. 4 is obtained by exposure using the semiconductor exposing apparatus.

The lower conductive layer 20 shown in FIG. 6 may be one of a polycide layer consisting of a polycrystalline silicon layer formed on a gate oxide layer of each MOS transistor and a refractory metal silicide layer, a surface layer of a drain/source doping region, and a metal layer. The plug 35 may be formed with a doped polycrystalline silicon or tungsten.

Therefore, the contact related defects and contact resistance of the semiconductor memory device is easily reduced without adding any fabrication processes.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A semiconductor memory device, comprising:

a conductive layer formed on a semiconductor substrate;

an insulation layer formed on the conductive layer;

an opening formed through a portion of the insulation layer on a portion of the conductive layer, the opening having a bilobate shape; and a contact formed in the opening.

2. The semiconductor memory device according to claim 1 wherein an upper surface of the conductive layer is exposed by the opening, the upper surface of the conductive layer having a bilobate shape with a first and a second round portions connected by a bridge portion.

3. The semiconductor memory device according to claim 1 wherein the opening is formed using a photomask having a pattern, the pattern having a first and a second substantially square portions connected by a bridge portion.

4. The semiconductor memory device according to claim 1 wherein the opening is formed using a photomask having a pattern, the pattern having a first and a second substantially square portions separated from each other by a predetermined distance.

5. The semiconductor memory device according to claim 1 wherein the predetermined distance is about 0.3 $\mu$m.

* * * * *